United States Patent [19]
Hsueh et al.

[11] Patent Number: 5,854,503
[45] Date of Patent: Dec. 29, 1998

[54] MAXIMIZATION OF LOW DIELECTRIC CONSTANT MATERIAL BETWEEN INTERCONNECT TRACES OF A SEMICONDUCTOR CIRCUIT

[75] Inventors: Cheng-Chen Hsueh, Sunnyvale; Shih-Ked Lee, Fremont; Chuen-Der Lien, Los Altos Hills, all of Calif.

[73] Assignee: Integrated Device Technology, Inc., Santa Clara, Calif.

[21] Appl. No.: 753,009

[22] Filed: Nov. 19, 1996

[51] Int. Cl.$^6$ .................................................. H01L 29/00
[52] U.S. Cl. ........................ 257/347; 257/374; 257/397; 257/510; 257/518; 257/908
[58] Field of Search ..................... 257/637, 644, 257/752, 758, 347, 374, 397, 510, 513, 518, 908

[56] References Cited

U.S. PATENT DOCUMENTS

| | | | |
|---|---|---|---|
| 4,986,878 | 1/1991 | Malazgirt et al. | 156/643 |
| 5,003,062 | 3/1991 | Yen | 437/231 |
| 5,128,279 | 7/1992 | Nariani et al. | 437/195 |
| 5,364,818 | 11/1994 | Ouellet | 437/195 |
| 5,403,780 | 4/1995 | Jain et al. | 437/195 |
| 5,413,963 | 5/1995 | Yen et al. | 437/195 |
| 5,422,312 | 6/1995 | Lee et al. | 437/195 |
| 5,442,211 | 8/1995 | Kita | 257/347 |
| 5,453,406 | 9/1995 | Chen | 437/231 |
| 5,457,073 | 10/1995 | Ouellet | 437/231 |
| 5,482,900 | 1/1996 | Yang | 437/228 |
| 5,567,970 | 10/1996 | Sheu et al. | 257/644 |
| 5,607,773 | 3/1997 | Ahlburn et al. | 428/427 |

FOREIGN PATENT DOCUMENTS

| | | | |
|---|---|---|---|
| 401286355 | 11/1989 | Japan | 257/347 |
| 404132257 | 5/1992 | Japan | 257/347 |
| 404164369 | 6/1992 | Japan | 257/347 |

*Primary Examiner*—Valencia Martin-Wallace
*Attorney, Agent, or Firm*—Bever & Hoffman, LLP

[57] ABSTRACT

A structure and method of maximizing the volume of low dielectric constant material between adjacent traces of a conductive interconnect structure. A semiconductor structure includes a semiconductor substrate, a first insulating layer located over the semiconductor substrate, a conductive interconnect layer having a plurality of conductive traces located over the first insulating layer, and a patterned insulating layer located over the patterned interconnect layer. One or more trenches are formed in the upper surface of the first insulating layer. These trenches, which do not extend completely through the first insulating layer, are located between adjacent traces of the interconnect layer. A dielectric material having a low dielectric constant is located in these trenches, and between adjacent traces of the patterned interconnect layer. The trenches advantageously maximize the volume of low dielectric constant material which is located between the traces.

10 Claims, 7 Drawing Sheets

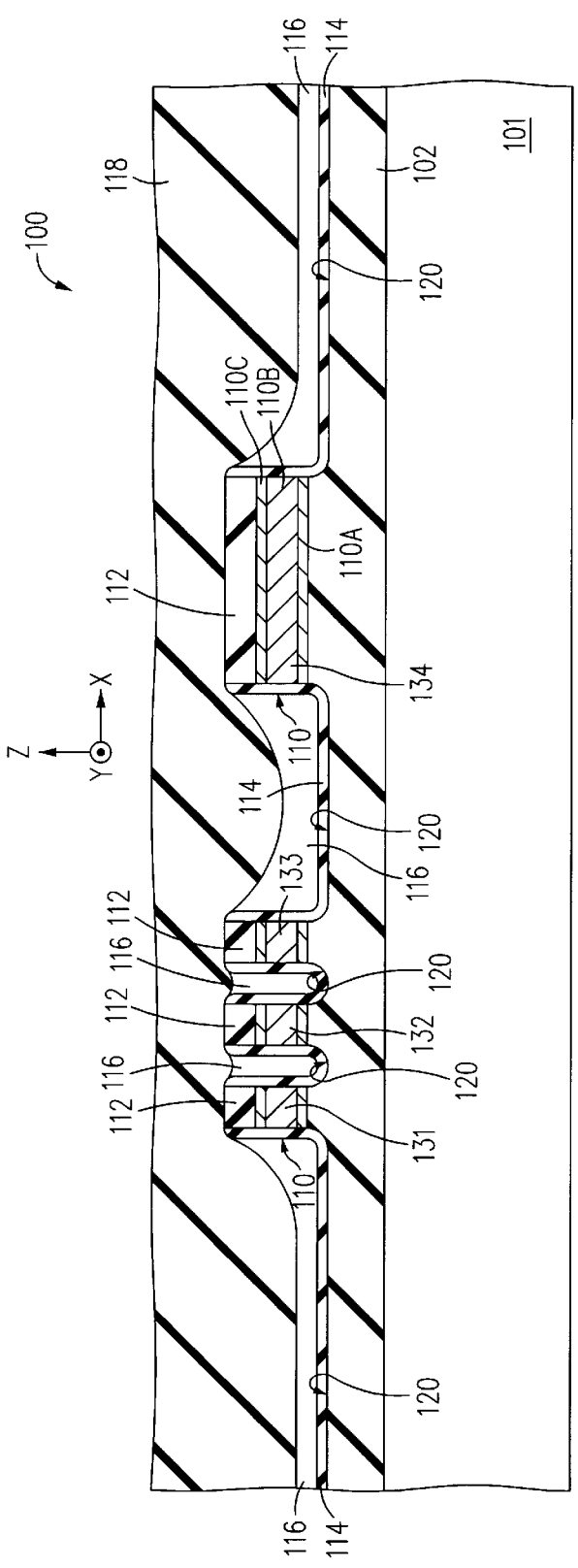
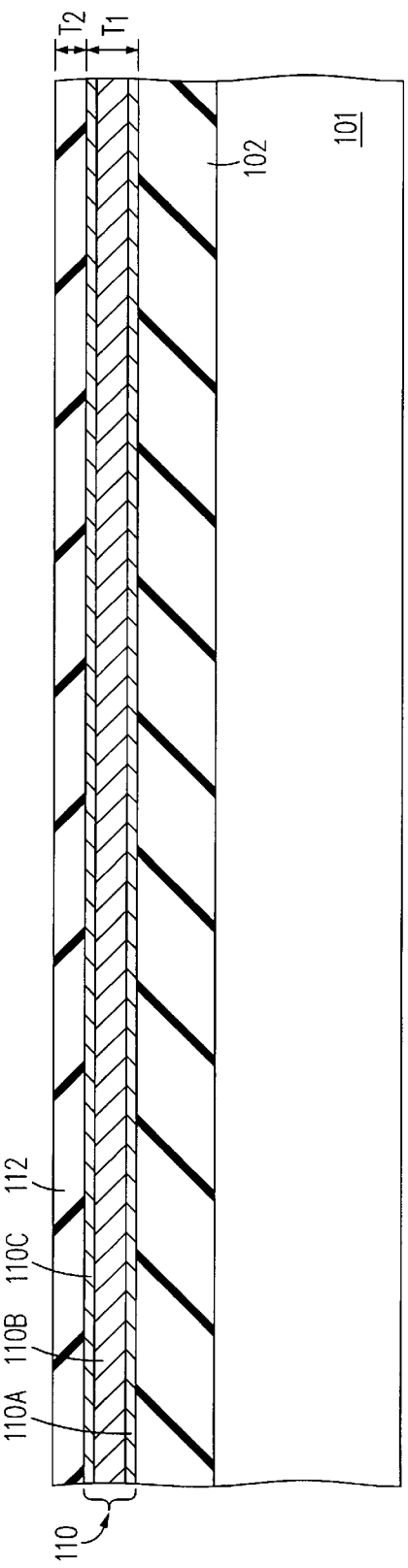
FIG. 4
FIG. 5A

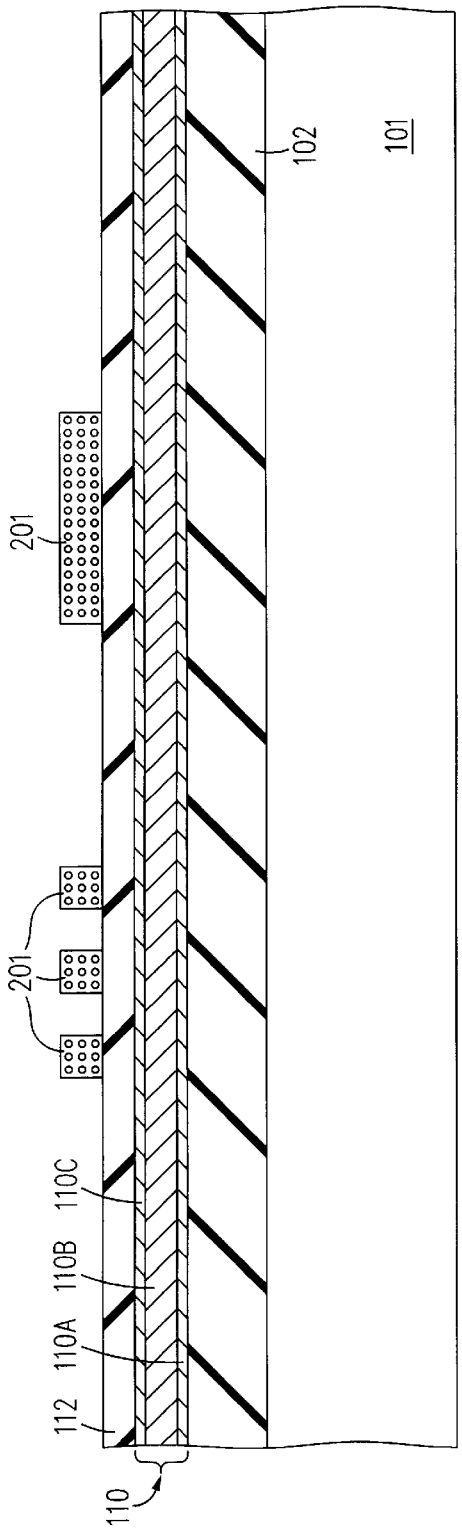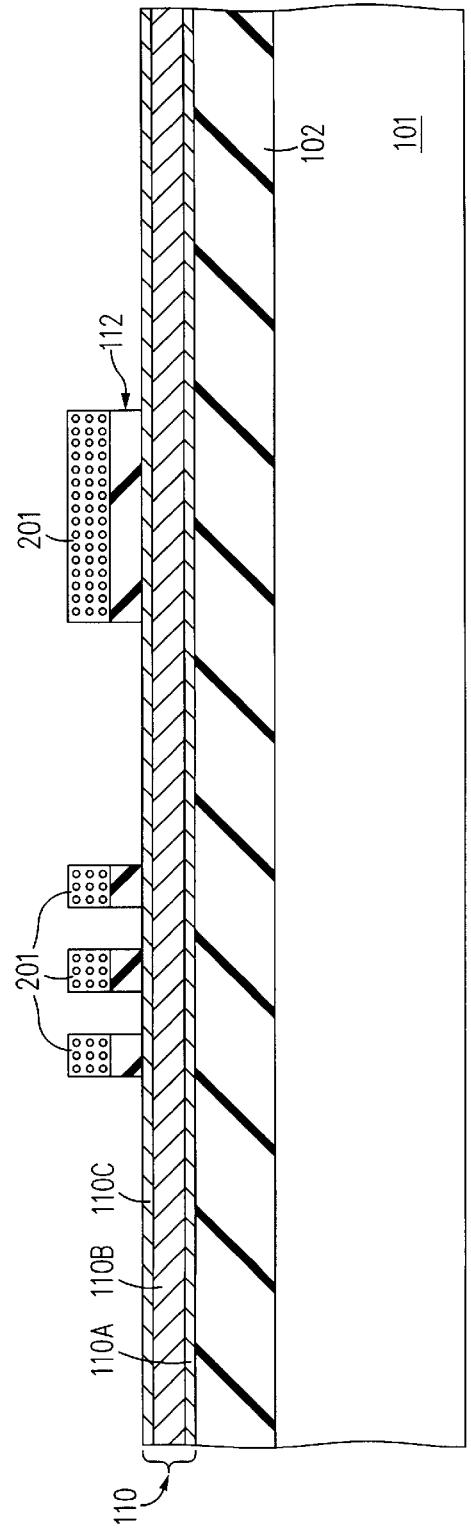

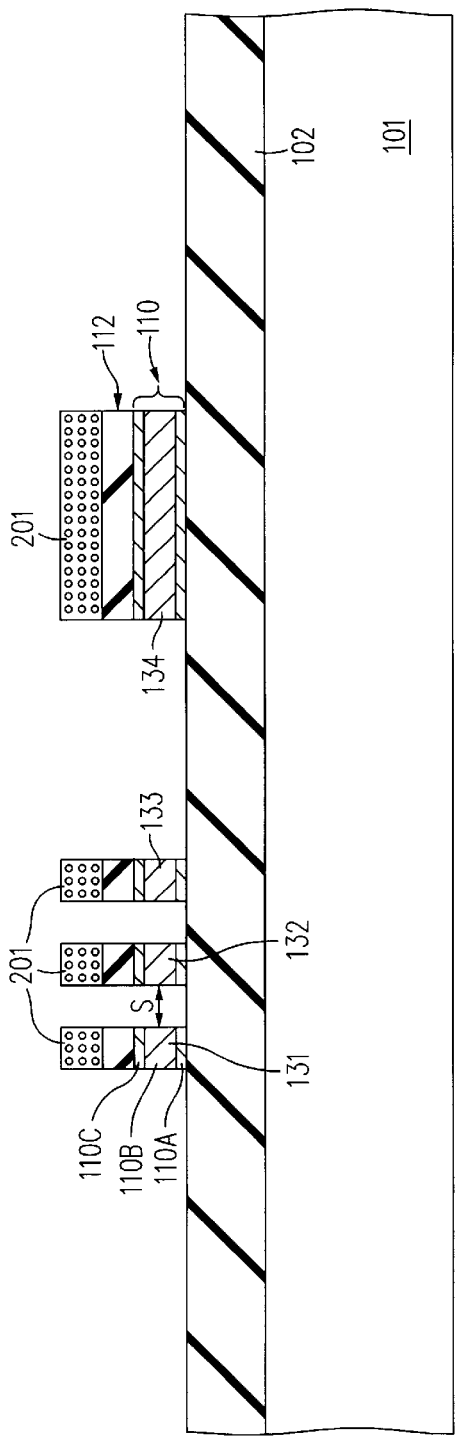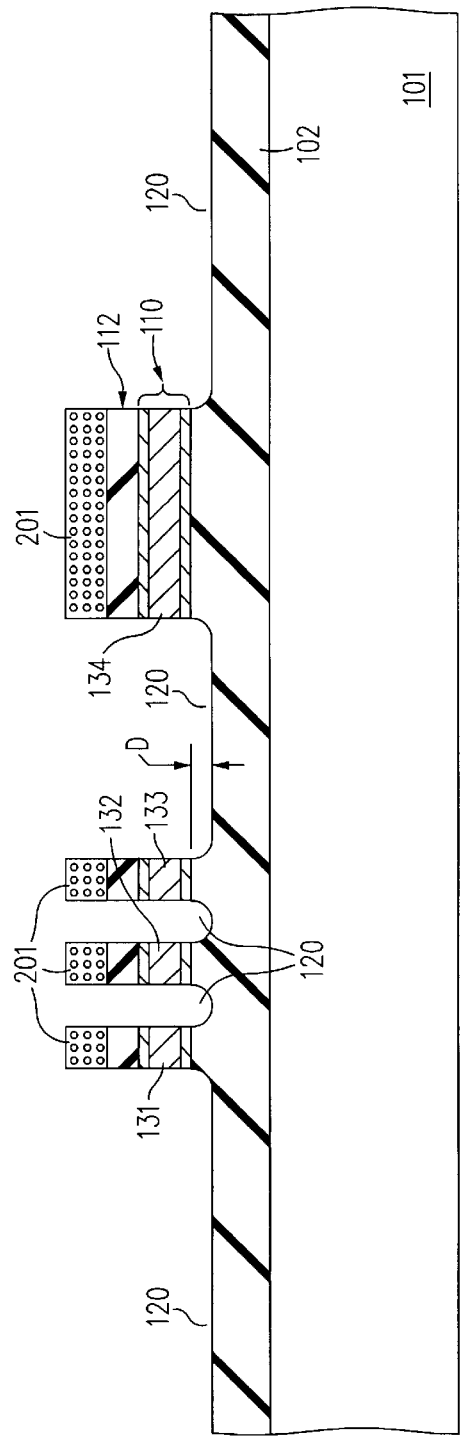

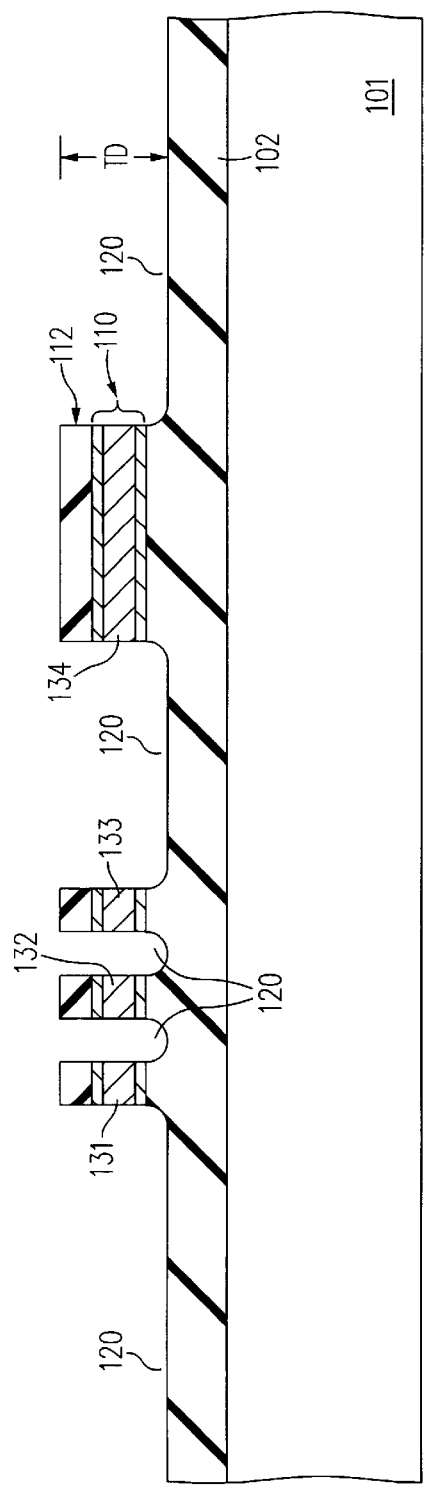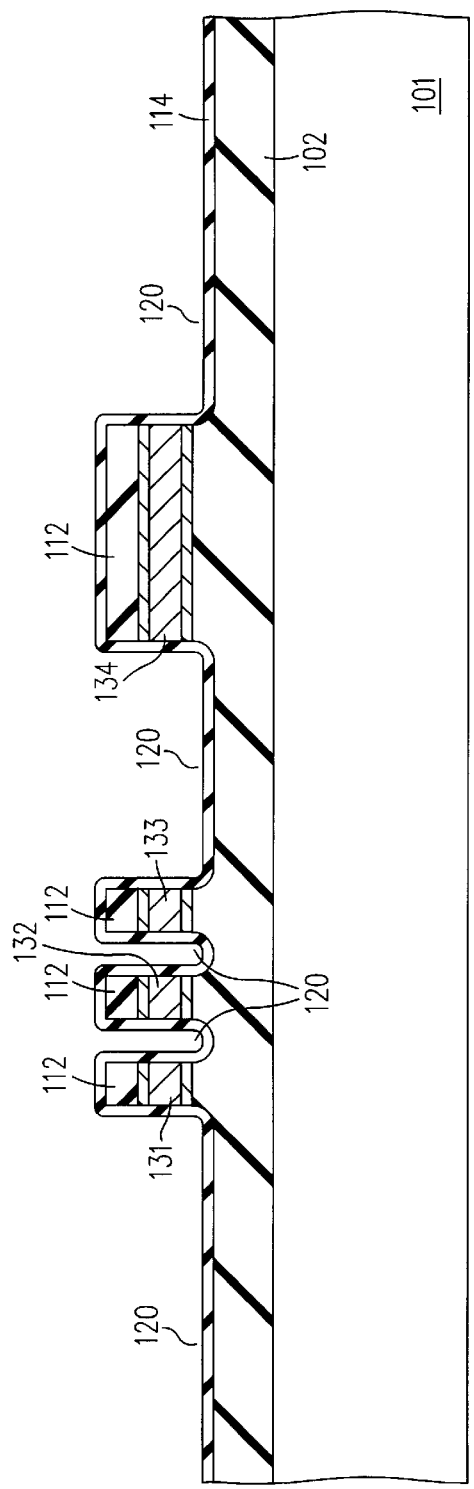
FIG. 5F
FIG. 5G

MAXIMIZATION OF LOW DIELECTRIC CONSTANT MATERIAL BETWEEN INTERCONNECT TRACES OF A SEMICONDUCTOR CIRCUIT

BACKGROUND OF THE INVENTION

1. Field of the Invention

The present invention relates to a semiconductor structure having an interconnect structure which includes a plurality of conductive traces. More specifically, invention relates a structure and method for maximizing the volume of a low dielectric constant material which is located between adjacent interconnect traces.

2. Description of the Prior Art

In the era of deep sub-micron semiconductor fabrication, the need to minimize interconnect capacitance is becoming more important to overcome the increased RC delay which results from shrinking geometry. One method of minimizing the capacitance of the interconnect structure of a semiconductor device is to provide a dielectric material having a low dielectric constant (K) between the conductive traces of the interconnect structure, such that intra-trace capacitance (which typically dominates the capacitance of the interconnect structure) is minimized. It would therefore be desirable to have a semiconductor structure which maximizes the volume of low dielectric constant material located between adjacent conductive traces in an interconnect structure.

U.S. Pat. No. 5,482,900 discloses the semiconductor structures illustrated in FIGS. 1–3. FIG. 1 is a cross sectional view of a semiconductor structure 1 including a metallurgy pattern 10, an insulating layer 11 and a semiconductor substrate 12. The metallurgy pattern 10 is covered with a thin conformal layer 14. A non-conformal layer 16 of spin-on-glass (SOG) 16 is deposited over layer 14. The narrow spacing between the lines of metallurgy pattern 10 can result in voids, such as void 18, between these lines. These voids exist because the spaces between the lines are so small that these spaces cannot be filled with the SOG material. As illustrated in FIG. 2, the SOG layer 16 is etched back to the upper surface of layer 14 where layer 14 extends over the metallurgy pattern 10. An oxide layer 20 is then formed over the resulting structure.

FIG. 3 is a cross sectional view of another semiconductor structure 2 disclosed in U.S. Pat. No. 5,482,900. Semiconductor structure 2 includes semiconductor substrate 12, insulating layer 11, metallurgy pattern 13, oxide layer 22, conformal oxide layer 26, SOG layer 28 and insulating layer 30. Semiconductor structure 2 is similar to semiconductor structure 1 (FIGS. 1–2), but additionally includes oxide layer 22 formed over metallurgy pattern 13.

As previously discussed, it would be desirable to have a semiconductor structure which maximizes the volume of a low dielectric constant material between conductive traces in an interconnect structure.

SUMMARY

Accordingly, the present invention provides a semiconductor structure having a first insulating layer located over a semiconductor substrate. A patterned electrically conductive interconnect layer having a plurality of conductive traces is located over the upper surface of the first insulating layer. One or more trenches are located in the upper surface of the first insulating layer. These trenches, which do not extend completely through the first insulating layer, are located between adjacent traces of the patterned interconnect layer. A patterned insulating layer is located over the patterned interconnect layer. A dielectric material having a low dielectric constant is located in the trenches and between the traces of the interconnect layer. In this semiconductor structure, the trenches located in the first insulating layer advantageously increase the volume of low dielectric constant material which is located between the traces of the patterned interconnect layer.

In an alternative embodiment, a thin conformal insulating layer is located over the trenches, the patterned interconnect layer and the patterned insulating layer. The dielectric material is located over the conformal insulating layer. The thin conformal insulating layer provides a moisture, contaminant and/or stress barrier to the resulting structure.

The present invention also includes a method of forming a semiconductor structure which includes the following steps: (1) forming a first insulating layer over a semiconductor substrate, (2) depositing a first interconnect layer over the first insulating layer, (3) depositing a second insulating layer over the first interconnect layer, (4) selectively etching completely through regions of the second insulating layer, (5) selectively etching completely through regions of the first conductive layer, (6) partially etching through regions of the first insulating layer, and (7) depositing a dielectric material into the regions etched in the second insulating layer, the first conductive layer and the first insulating layer. An alternative method further includes the step of depositing a thin conformal insulating layer over the etched second insulating layer, the etched first interconnect layer and the etched first insulating layer prior to the step of depositing the dielectric material.

In the previously described embodiments, the dielectric material has a relative low dielectric constant K. In particular embodiments, the dielectric material can be SOG material, or a dielectric material having a dielectric constant K of less than four.

The present invention will be more fully understood in light of the following detailed description taken together with the drawings.

BRIEF DESCRIPTION OF THE DRAWINGS

FIG. 4 is a cross sectional view of a semiconductor structure in accordance with one embodiment of the present invention;

FIGS. 5A–5J are cross sectional views illustrating process steps used to fabricate the semiconductor structure of FIG. 4 in accordance with one embodiment of the present invention.

DETAILED DESCRIPTION

Figure 1:
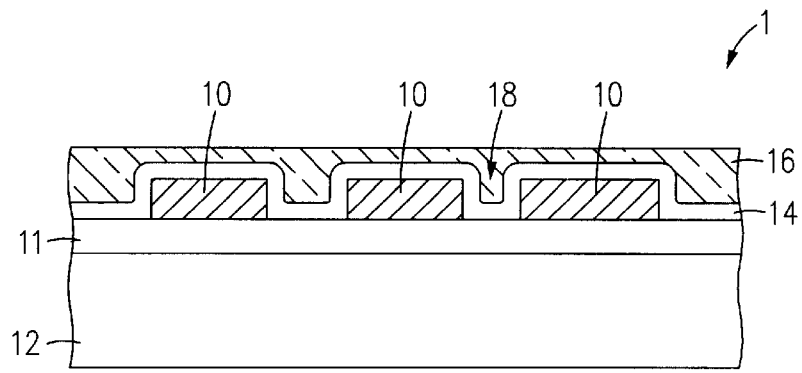
FIGS. 1–3 are cross sectional views of conventional semiconductor interconnect structures.
Figure 2:
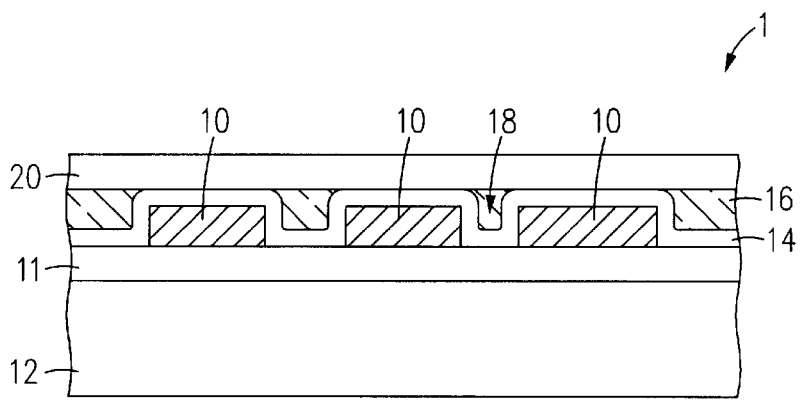
Figure 3:
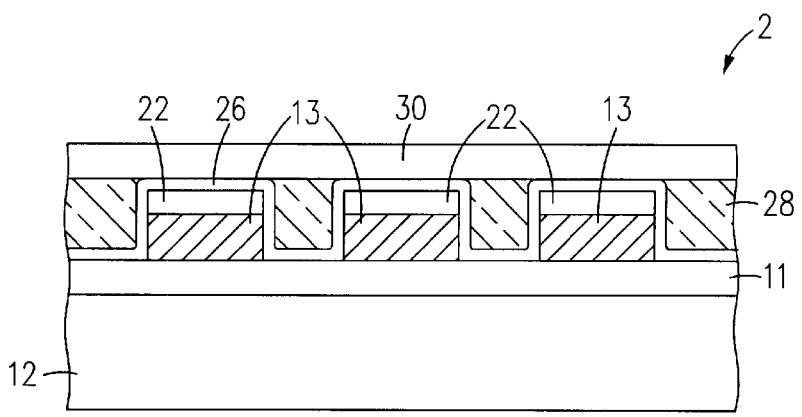

FIG. 4 is a cross sectional view of a semiconductor structure 100 in accordance with one embodiment of the present invention. Semiconductor structure 100 includes semiconductor substrate 101, electrically insulating layer 102, patterned electrically conductive interconnect layer 110 (including barrier layer 110A, main layer 110B and anti-reflective layer 110C), patterned electrically insulating layer 112, thin conformal electrically insulating layer 114, dielectric layer 116, and electrically insulating layer 118. Patterned interconnect layer 110 includes a plurality of lines 131–133 and a pad 134, hereinafter collectively referred to as traces 133–134. Although not shown in FIG. 4, it is understood that electrically conductive via plugs extend through insulating layer 102 to connect various traces in patterned interconnect layer 110 to semiconductor circuit elements (e.g., transistors, diodes, resistors) fabricated in semiconductor substrate 101. Moreover, although three lines and one pad are illustrated in FIG. 4, in other embodiments, interconnect layer 110 can have virtually any number of traces and/or pads, which are arranged in any number of patterns.

As described in more detail below, a plurality of trenches 120 extend into the upper surface of insulating layer 102. Each of these trenches 120 has lower surface which is located lower (along the Z-axis) than the lower surfaces of the traces 131–134 of patterned interconnect layer 110. As described in more detail below, these trenches 120 facilitate the inclusion of a large volume of dielectric material 116 between traces 131–134 of patterned interconnect layer 110. The greater the volume of dielectric material between traces 131–134, the lower the intra-trace capacitance.

Figure 5H:
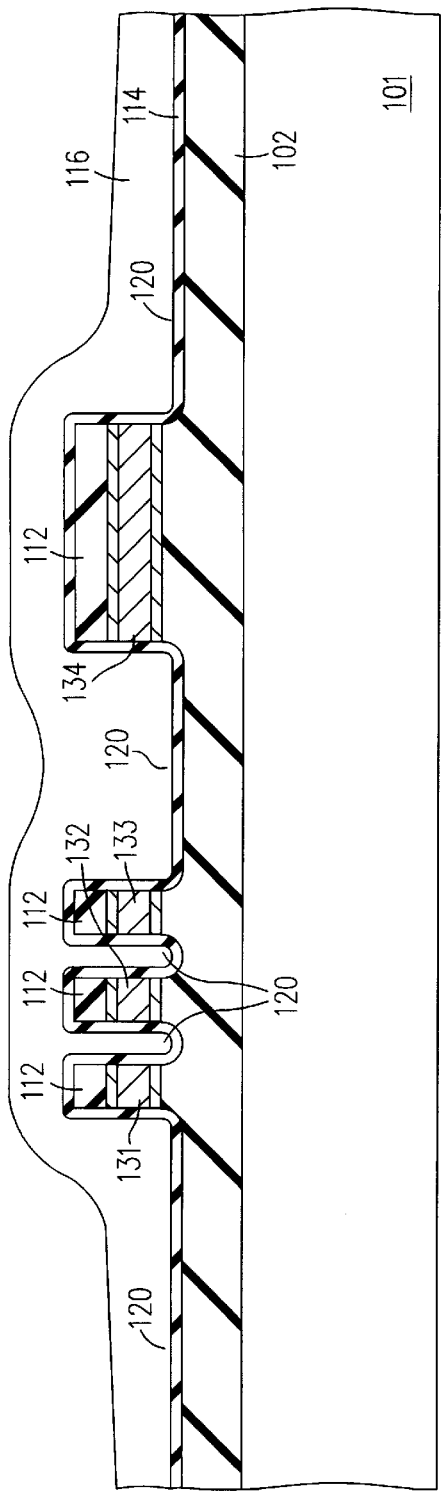

FIGS. 5A–5I are cross sectional views illustrating process steps used to fabricate the semiconductor structure 100 of FIG. 4 in accordance with one embodiment of the present invention. As illustrated in FIG. 5A, insulating layer 102 is formed at the upper surface of semiconductor substrate 101. Semiconductor substrate 101 is typically monocrystalline silicon, but can be any type of semiconductor material. In the described embodiment, insulating layer 102 is silicon oxide having a thickness in the range of approximately 0.5 $\mu$m to 2.0 $\mu$m. Insulating layer 102 is fabricated using a plasma enhanced chemical vapor deposition (PECVD) process or an atmospheric pressure chemical vapor deposition (APCVD) process as known to one of ordinary skill in the art. In an alternative embodiment, insulating layer 102 can be made of silicon nitride. However, because silicon oxide has a lower dielectric constant K than silicon nitride, silicon oxide is preferred for insulating layer 102.

An electrically conductive barrier layer 110A having a thickness in the range of a few hundred angstroms (Å) to 2000 Å is formed over the upper surface of insulating layer 102. In the described embodiment, barrier layer 110A is titanium (Ti), titanium nitride (TiN), or titanium tungsten (TiW) which is sputtered onto the upper surface of insulating layer 102. Barrier layer 110A provides a good metallurgical foundation for the subsequent fabrication of the main layer 110B of interconnect layer 110, and prevents aluminum junction spiking during the fabrication of this main layer 110B.

Electrically conductive main layer 110B is formed over the upper surface of barrier layer 110A. In the described embodiment, main layer 110B is an aluminum (or aluminum alloy) layer having a thickness in the range of 4000 Å to 1.5 $\mu$m. Main layer 110B is fabricated using a conventional sputtering process. The main layer 110B provides the bulk of the current carrying capacity of interconnect layer 110. In other embodiments, the main layer 110B can be fabricated from other electrically conductive materials, such as another metal (or metal alloy), conductively doped polycrystalline silicon, or a metal silicide.

Anti-reflective coating (ARC) layer 110C is formed over the upper surface of main layer 110B. In the described embodiment, ARC layer 110C is TiN or TiW, sputtered to a thickness of approximately a few hundred angstroms. ARC layer 110C has a lower reflectivity than main layer 110B, as required to facilitate correct pattern definition during subsequent photolithography steps. The overall thickness T1 of interconnect layer 110 in the described embodiment is approximately 0.8 $\mu$m, although other thicknesses are possible.

Insulating layer 112 is formed over the upper surface of ARC layer 110C using, for example, a conventional PECVD process. In one embodiment, insulating layer 112 is a layer of silicon oxide having a thickness in the range of a few hundred angstroms to 2 $\mu$m. In another embodiment, insulating layer is formed from another electrically insulating material, such as silicon nitride. In the described embodiment, insulating layer 112 has a thickness T2 of approximately 0.7 $\mu$m.

Turning now to FIG. 5B, an etch mask 201 is formed over the upper surface of insulating layer 112. As described in more detail below, mask 201 defines the locations of the traces 131–134 (and the other features of patterned interconnect layer 110 not shown in the cross section of FIG. 4). Mask 201 is formed by depositing a layer of photoresist over the entire upper surface of insulating layer 112, exposing selected areas of the photoresist layer to ultra-violet light through a reticle which defines the desired pattern of mask 201, and then developing the photoresist layer to remove the undesired portions of the photoresist layer.

A first etch is then performed using conventional techniques to remove the portions of insulating layer 112 which are not covered by the mask 201. The resulting patterned insulating layer 112 is illustrated in FIG. 5C.

Next, as illustrated in FIG. 5D, a second etch is performed to remove the portions of interconnect layer 110 which are not covered by the mask 201, thereby forming traces 131–134 of patterned interconnect layer 110. This second etch is performed using conventional processing steps. As an example, the minimum spacing S between adjacent traces 131 and 132 in the described embodiment is approximately 0.42 to 0.5 $\mu$m. However, it is understood that this minimum spacing S will vary with the minimum feature size of the process being used.

The second etch is continued to create trenches 120 in insulating layer 102, as illustrated in FIG. 5E. Trenches 120 are formed at the regions of insulating layer 102 which are not covered by the mask 201. The lower surfaces of trenches 120 are located at a depth D below the lower surfaces of the traces of interconnect layer 110. In the described embodiment, trenches 120 extend into insulating layer 102 to a depth D of approximately 0.5 $\mu$m. In other embodiments, trenches 120 can have other depths. However, trenches 120 should only extend partially through insulating layer 102. That is, at least a few hundred angstroms of insulating layer 102 should remain between the lower surfaces of trenches 120 and the lower surface of insulating layer 102. In other embodiments, similar results can be achieved using a different number of etches.

Trenches 120 increase the depth, and therefore the volume, of the cavities which exist between adjacent traces 131–134 of interconnect layer 110. This advantageously allows a greater volume of low dielectric material to be located in these cavities, when compared with prior art semiconductor structures. As a result, the intra-trace capacitance is advantageously reduced.

As shown in FIG. 5F, mask 201 is stripped after trenches 120 are formed. In the described embodiment, the total depth TD from the upper surface of the insulating layer 112 to the lower surface of the trenches 120 is approximately 2.0 $\mu$m (i.e., 0.7 $\mu$m+0.8 $\mu$m+0.5 $\mu$m). Again, in other embodiments, different total depths TD are possible.

A thin conformal insulating layer 114 is then deposited over the exposed surfaces of the resulting structure, as illustrated in FIG. 5G. In the described embodiment, layer 114 is a silicon oxide liner having a thickness in the range of a few hundred angstroms to 2000 Å. In this embodiment, insulating layer 114 is fabricated using conventional PECVD processing steps.

Figure 6:
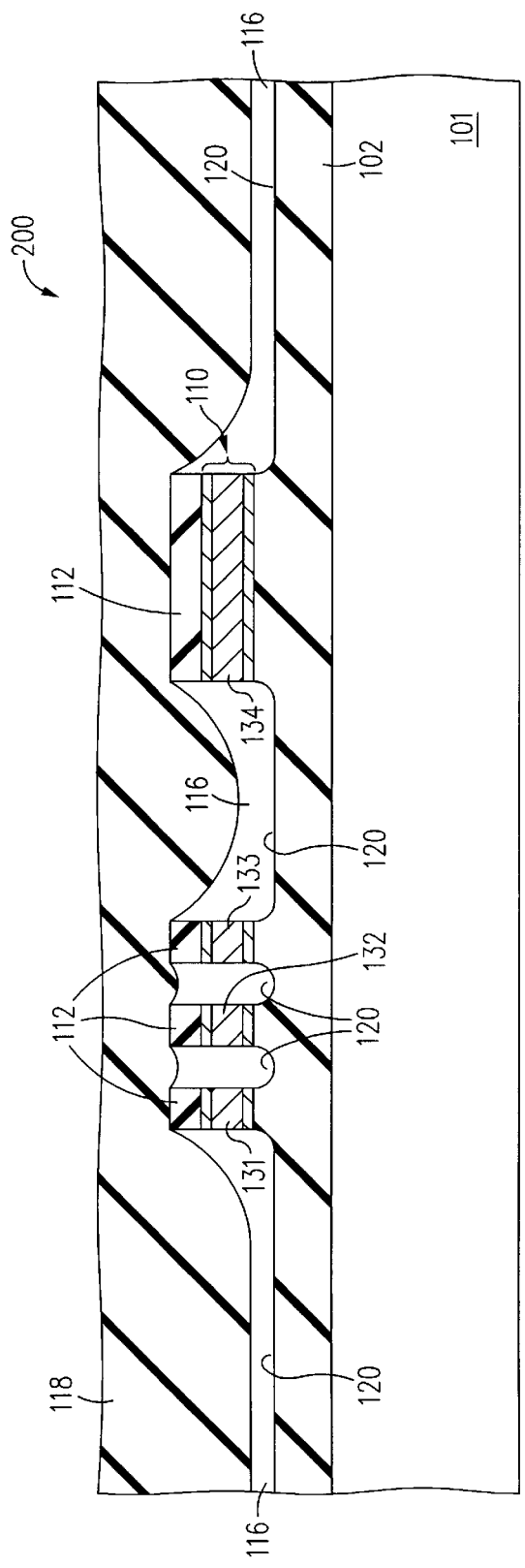
FIG. 6 is a cross sectional view of a semiconductor structure in accordance with an alternative embodiment of the present invention.

Thin insulating layer 114 is provided for various reasons. For example, thin insulating layer 114 can be provided as a moisture barrier, as a stress buffer layer, or to protect the interconnect layer 110 from organic matter which is present in the subsequently formed dielectric layer 116. In an alternative embodiment, thin insulating layer 114 is eliminated. As a general rule, thin insulating layer 114 is eliminated as the spacing between adjacent conductive traces becomes smaller. Eliminating insulating layer 114 increases the volume of the cavities between adjacent traces 131–134. As a result, more low dielectric material can be located in these cavities, thereby further reducing the intra-trace capacitance of the finished semiconductor device. FIG. 6 is a cross sectional diagram illustrating a semiconductor structure 200 which does not include thin insulating layer 114 in accordance with such an alternative embodiment.

Figure 5I:
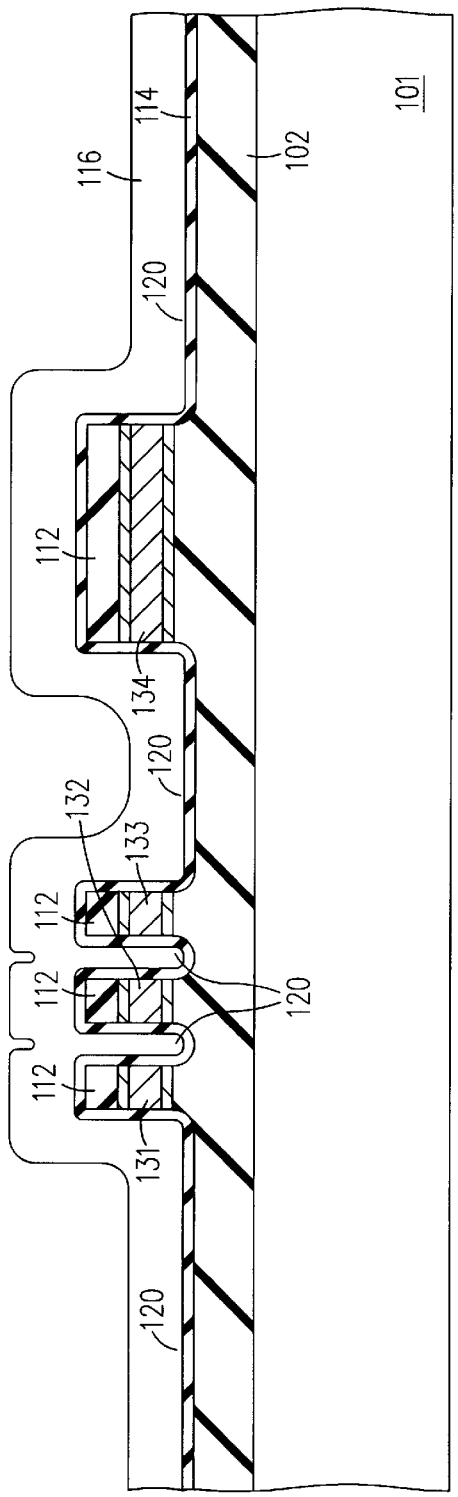

Turning now to FIGS. 5H and 5I, a dielectric layer 116 is deposited over the upper surface of the resulting structure. Dielectric layer 116 can be fabricated using conventional CVD or SOG processing steps. FIG. 5H illustrates a dielectric layer 116 formed using conventional SOG process steps. In this embodiment, the thickness of dielectric layer 116 is typically no greater than 1 μm due to the physical characteristics of the SOG material and the process steps used to apply the SOG material. FIG. 5I illustrates a dielectric layer 116 formed using conventional CVD process steps in accordance with an alternative embodiment. In this embodiment, the thickness of dielectric layer 116 can be greater than 3 μm. In either alternative, dielectric layer 116 extends into trenches 120.

In one embodiment, the dielectric layer 116 is made from an SOG material which has a relatively low dielectric constant K of approximately 4. In other embodiments, dielectric layer 116 can be made from another low dielectric constant material. For purposes of the present disclosure, a low dielectric constant material is defined as a material having a dielectric constant of less than 4.

Dielectric layer 116 extends into the cavities which exist between the adjacent traces 131–134. The depth of trenches 120 is selected such that the lowermost surfaces of the dielectric layer 116 extend below the lowermost surfaces of conductive traces 131–134. Consequently, trenches 120 serve to maximize the volume of dielectric material located between traces 131–134, thereby minimizing the intra-trace capacitance.

Figure 5J:
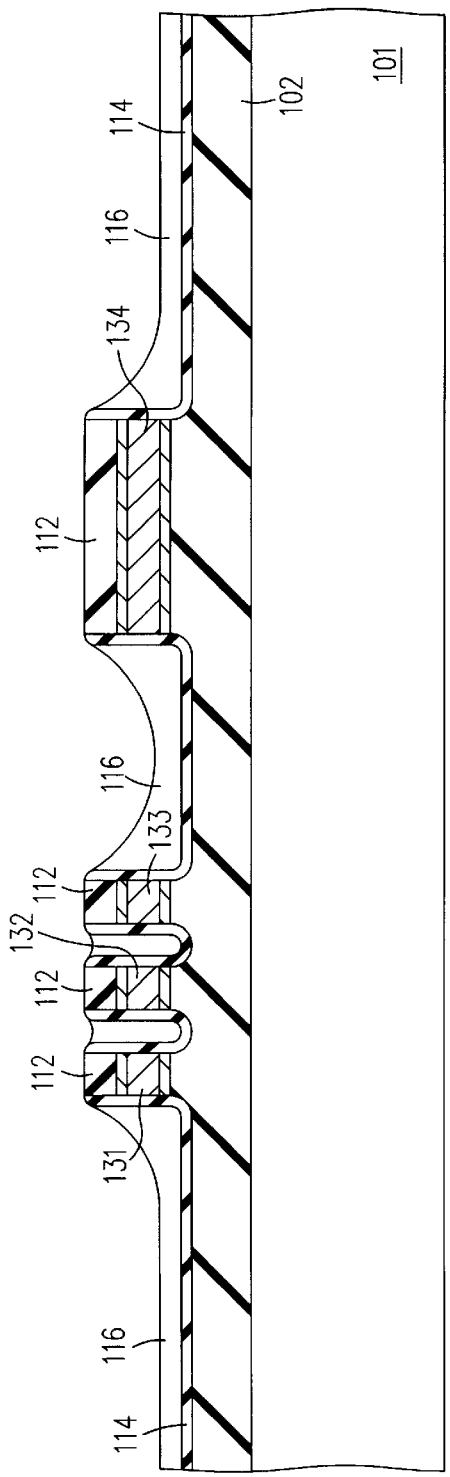

Turning now to FIG. 5J, a conventional etchback step is performed to remove the upper portion of dielectric layer 116. The etchback step is continued until patterned insulating layer 112 is exposed. The etchback step is optional. The etchback step can be replaced with a timed etch, in which etching is terminated after a specific time interval. In this embodiment, patterned insulating layer 112 functions as an etchstop, thereby providing a greater margin for over-etch errors.

The second insulating layer 118 is then deposited over the upper surface of the resulting structure thereby creating the semiconductor structure 100 illustrated in FIG. 4. Insulating layer 118 is typically silicon oxide having a thickness in the range of 3000 Å to 2 μm, and is fabricated using a conventional PECVD process. The upper surface of insulating layer 118 is planarized, thereby enabling additional interconnect structures to be fabricated over insulating layer 118 using the process steps previously described. Although not shown in FIG. 4, electrically conductive via plugs extend through insulating layer 118 to provide electrical connections to one or more of the conductive traces 131–134 of interconnect layer 110.

Insulating layer 118 imparts stability to dielectric layer 116. In the foreseeable event that a highly thermally stable dielectric material is discovered, then dielectric layer 116 can be deposited to a sufficient thickness to allow dielectric layer 116 to be planarized. In such a case, insulating layer 118 is not required to cap dielectric layer 116.

The foregoing has described the principles and preferred embodiments of the present invention. However, the invention should not be construed as being limited to the particular embodiments described. The above-described embodiments should be regarded as illustrative rather than restrictive. Variations can be made to those embodiments by workers skilled in the art without departing from the scope of the present invention as defined by the following claims.

We claim:

1. A semiconductor structure comprising:
   a substrate;
   a first insulating layer located over the substrate, the first insulating layer having an upper surface;
   a patterned conductive interconnect layer located over portions of the upper surface of the first insulating layer, the interconnect layer having a plurality of traces;
   one or more trenches located in the upper surface of the first insulating layer, wherein the trenches are located between the traces of the interconnect layer;
   a patterned insulating layer located over the patterned interconnect layer; and
   a dielectric material located in the trenches and between the traces of the interconnect layer.

2. The semiconductor structure of claim 1, further comprising a conformal insulating layer located over the trenches, the patterned interconnect layer and the patterned insulating layer, wherein the dielectric material is located over the conformal insulating layer.

3. The semiconductor structure of claim 1, wherein the dielectric material comprises spin-on-glass material.

4. The semiconductor structure of claim 1, wherein the dielectric material has a dielectric constant of less than 4.

5. The semiconductor structure of claim 1, wherein the patterned insulating layer is aligned with the patterned interconnect layer.

6. A semiconductor structure comprising:
   a substrate;
   a first insulating layer located over the substrate, the first insulating layer having an upper surface;
   a plurality of conductive traces located over portions of the upper surface of the first insulating layer;
   a plurality of trenches extending partially into the upper surface of the first insulating layer, wherein the trenches are located between the conductive traces;
   insulative areas located over the conductive traces; and
   a dielectric material located in the trenches and between the conductive traces.

7. The semiconductor structure of claim 6, further comprising a conformal insulating layer located over the trenches, the traces and the insulative areas, wherein the dielectric material is located over the conformal insulating layer.

8. The semiconductor structure of claim 6, wherein the dielectric material comprises spin-on-glass material.

9. The semiconductor structure of claim 6, wherein the dielectric material has a dielectric constant of less than 4.

10. The semiconductor structure of claim 6, wherein the insulative areas are aligned with the conductive traces.

* * * * *